US012035513B2

(12) United States Patent
Nagasaka

(10) Patent No.: US 12,035,513 B2
(45) Date of Patent: Jul. 9, 2024

(54) DISCHARGE UNIT AND ELECTRIC POWER APPARATUS

(71) Applicant: TMEIC Corporation, Chuo-ku (JP)

(72) Inventor: Kuniaki Nagasaka, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 0 days.

(21) Appl. No.: 17/789,467

(22) PCT Filed: Nov. 12, 2020

(86) PCT No.: PCT/JP2020/042267
§ 371 (c)(1),
(2) Date: Jun. 27, 2022

(87) PCT Pub. No.: WO2022/102055
PCT Pub. Date: May 19, 2022

(65) Prior Publication Data
US 2023/0269917 A1 Aug. 24, 2023

(51) Int. Cl.
*H05K 7/20* (2006.01)
*H02M 1/32* (2007.01)
(52) U.S. Cl.
CPC .......... *H05K 7/20927* (2013.01); *H02M 1/32* (2013.01)
(58) Field of Classification Search
CPC ............ H05K 7/20927; H05K 7/20272; F28F 2265/16
See application file for complete search history.

(56) References Cited

U.S. PATENT DOCUMENTS

| 9,007,221 | B2 * | 4/2015 | Zeighami | H05K 7/20836 |
| | | | | 165/80.4 |
| 9,345,170 | B2 * | 5/2016 | Ishikawa | G01M 3/04 |
| 9,433,132 | B2 * | 8/2016 | Krishnan | H05K 7/20818 |

FOREIGN PATENT DOCUMENTS

| CN | 108156796 A | | 6/2018 |
| CN | 109245558 A | * | 1/2019 |
| CN | 211744984 U | | 10/2020 |
| JP | H0648299 Y2 | * | 12/1994 |
| JP | 9-84349 A | | 3/1997 |
| JP | 10-144838 A | | 5/1998 |
| JP | 2009-90192 A | | 4/2009 |
| JP | 2010-113959 A | | 5/2010 |
| JP | 2011-54423 A | | 3/2011 |

OTHER PUBLICATIONS

CN-109245558-A Translation.*
International Search Report dated Jan. 26, 2021 in PCT/JP2020/042267 filed Nov. 12, 2020, 4 pages.
Office Action issued Mar. 12, 2024, in Indian Patent Application No. 202217037143 w/English-language Translation.

* cited by examiner

*Primary Examiner* — Jacob R Crum
*Assistant Examiner* — Matthew Sinclair Muir
(74) *Attorney, Agent, or Firm* — Oblon, McClelland, Maier & Neustadt, L.L.P.

(57) ABSTRACT

A discharge unit of an embodiment includes a drain pan, a discharge portion having an insulation property, a grounded drain piping, and a liquid separation part having an insulation property. The drain pan receives a liquid. The discharge portion is connected to the drain pan and drains the liquid remaining in the drain pan. The liquid separation part prevents the liquid from flowing continuously between the discharge portion and the drain piping.

3 Claims, 3 Drawing Sheets

DISCHARGE UNIT AND ELECTRIC POWER APPARATUS

TECHNICAL FIELD

An embodiment of the present invention relates to a discharge unit and an electric power apparatus.

BACKGROUND

For example, a water-cooled cooling unit for cooling a circuit (for example, an electric power conversion unit) housed within a housing may be provided on an electric power conversion apparatus or the like. In such a case, there may be a case in which the voltage of the apparatus is high and a circuit to be cooled is charged to a main circuit potential. In this case, since the cooling unit in the apparatus also becomes the main circuit potential, insulated pure water is often used as cooling water. The electric conductivity of the pure water is adjusted through an ion-exchange resin, and the pure water flows through a closed circulation flow path.

Various techniques are disclosed as measures against water leakage in the apparatus. For example, techniques are disclosed in which a drain pan that receives leaked water and a drain piping that drains water remaining in the drain pan are provided in the apparatus (for example, refer to Patent Documents 1 and 2).

For example, when the apparatus and the drain pan are integrated, the drain pan itself becomes the main circuit potential. Further, since the electric conductivity of the leaked water deteriorates and the leaked water is not pure water, the water remaining in the drain pan may be charged to the main circuit potential. When such water is discharged through a grounded drain piping having a ground potential, a ground fault of the circuit may occur via the leaked water.

RELATED ART DOCUMENTS

Patent Documents

[Patent Document 1]
Japanese Unexamined Patent Application, First Publication No. H9-84349
[Patent Document 2]
Japanese Unexamined Patent Application, First Publication No. H10-144838

SUMMARY OF INVENTION

Problems to Be Solved By the Invention

A problem to be solved by the present invention is to provide a discharge unit and an electric power apparatus that can prevent a drain pan and a grounded drain piping from being electrically connected to each other via a liquid such as water.

Means for Solving the Problem

A discharge unit of an embodiment includes a drain pan, a discharge portion having an insulation property, a grounded drain piping, and a liquid separation part having an insulation property. The drain pan receives a liquid. The discharge portion is connected to the drain pan and drains the liquid remaining in the drain pan. The liquid separation part prevents the liquid from flowing continuously between the discharge portion and the drain piping.

DESCRIPTION OF THE EMBODIMENTS

Hereinafter, a discharge unit and an electric power apparatus according to an embodiment will be described with reference to the drawings.

Figure 1:
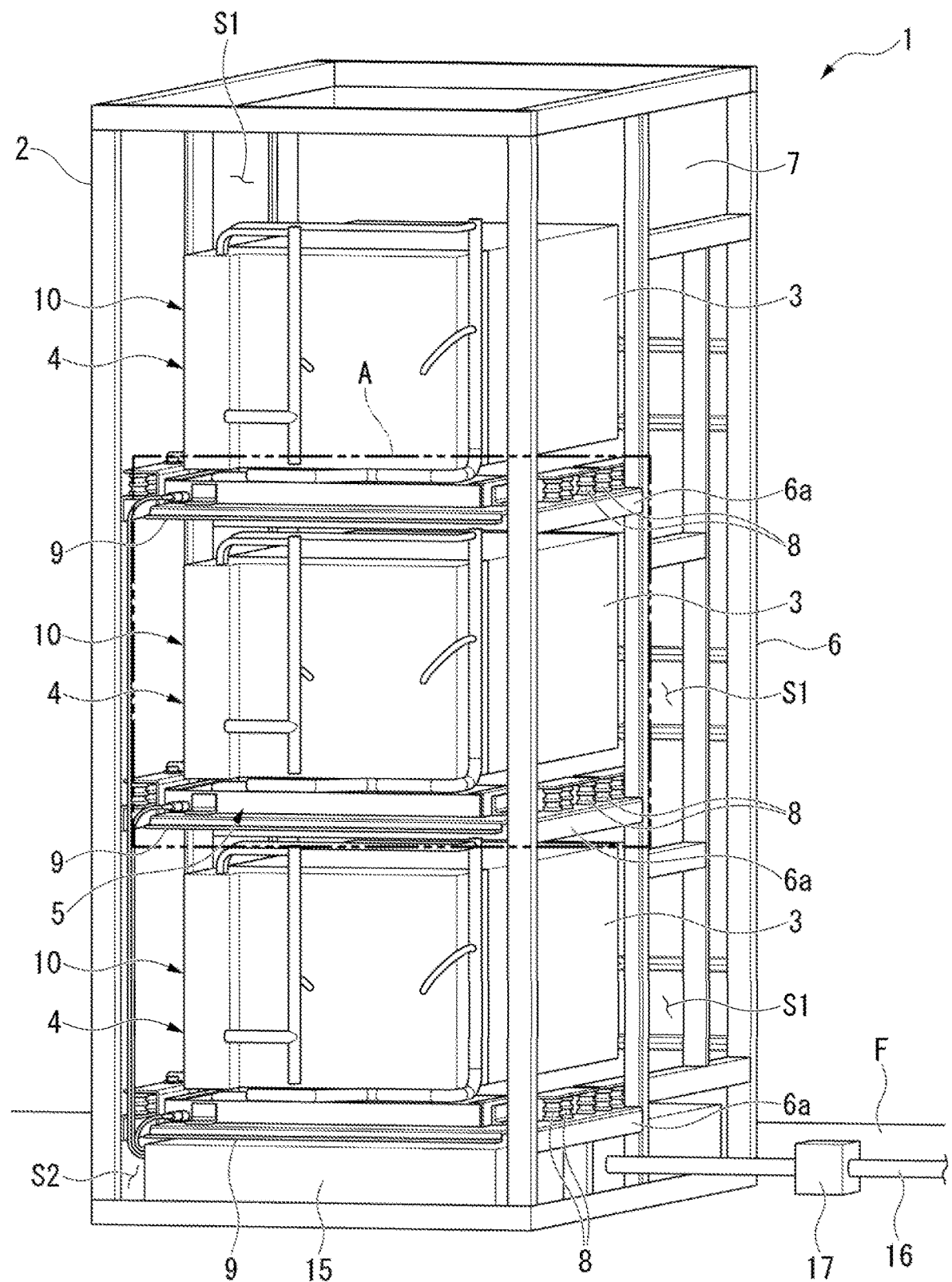
FIG. 1 is a perspective view showing an electric power apparatus according to an embodiment.
Figure 2:
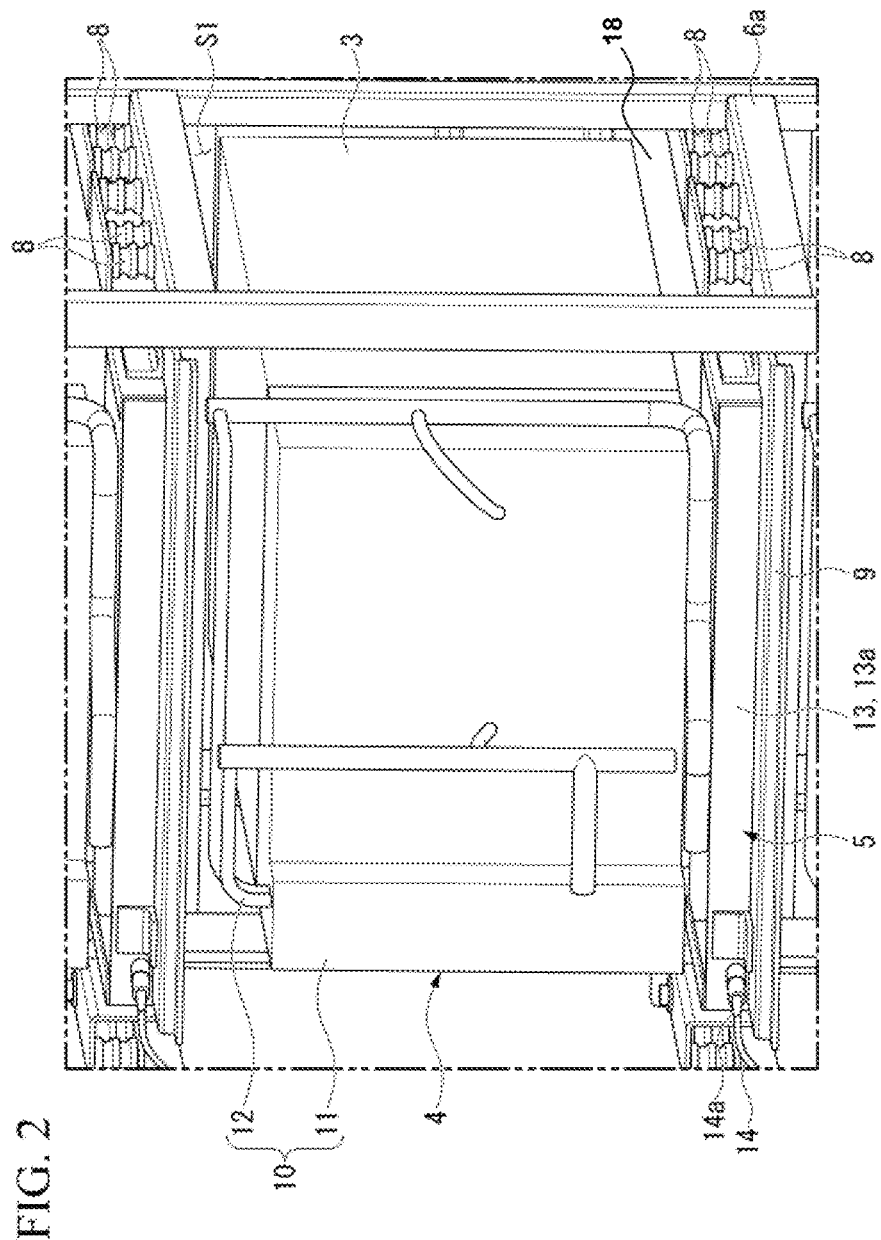
FIG. 2 is an enlarged view of part A of FIG. 1.

FIG. 1 is a perspective view of an electric power apparatus 1. FIG. 2 is an enlarged view of part A of FIG. 1.

As shown in FIG. 1 and FIG. 2, the electric power apparatus 1 includes an electric power apparatus housing (an example of an apparatus housing in the claims) 2, an electrical device 3 housed in the electric power apparatus housing 2, a cooling unit 4 for cooling the electrical device 3, and a drain unit (an example of a discharge unit in the claims) 5 provided on the electric power apparatus housing 2. In the following description, the vertical direction and the horizontal direction in a state where the electric power apparatus 1 is disposed on a floor F are referred to simply as a vertical direction and a horizontal direction, respectively.

The electric power apparatus housing 2 is formed in a cuboid shape elongated in the vertical direction. That is, the electric power apparatus housing 2 includes a frame body 6 that extends in the vertical direction and the horizontal direction and a cover 7 that covers an opening of the frame body 6 from the outside. For ease of explanation, FIG. 1 shows a state in which part of the cover 7 are removed.

An intermediate frame 6a that constitutes part of the frame body 6 and extends in the horizontal direction, and a shelf plate 9 that is provided on the intermediate frame 6a via an insulator 8 are provided inside the electric power apparatus housing 2.

The inside of the electric power apparatus housing 2 is partitioned into three unit housing chambers S1 that are aligned in the vertical direction by three intermediate frames 6a and shelf plates 9, and a drain chamber S2 that is located at a lowest portion. The electrical device 3 and the cooling unit 4 are housed in each unit housing chamber S1. A drain housing 15 described later is housed in the drain chamber S2.

The electrical device 3 is arranged on each shelf plate 9. The electrical device 3 is, for example, a circuit unit that constitutes an electric power conversion device, an electric source device, a motor drive device, or the like, and is constituted of a variety of electrical devices such as a transformer, a switch, a circuit breaker, a measurement device, and a control device.

The cooling unit 4 is a so-called water cooling system in which water is used as a refrigerant. The cooling unit 4 includes a unit main body 10 that is provided on the shelf plate 9 and on a side portion of the electrical device 3. The unit main body 10 includes a cooling housing 11 and a refrigerant piping 12 arranged in the cooling housing 11.

The cooling housing 11 is formed in a cuboid shape. Water as a refrigerant flows through the refrigerant piping 12. The refrigerant piping 12 is arranged unicursally within the cooling housing 11. A piping on an inlet side and a piping on an outlet side of the refrigerant piping 12 protrude from the cooling housing 11. The inlet and the outlet of the refrigerant piping 12 that protrude from the cooling housing 11 are connected to a refrigerant circulation pump (not shown). Water is circulated in the refrigerant piping 12 by the refrigerant circulation pump. Thereby, the electrical device 3 is cooled.

In addition, the cooling unit 4 includes a water amount detection device (not shown) that monitors the amount of water which circulates in the refrigerant piping 12. For example, when the amount of water which circulates in the refrigerant piping 12 becomes less than a predetermined threshold value due to water leakage of the cooling unit 4 or the like, the electric power apparatus 1 may be stopped, or an alarm may be displayed based on a detection result of the water amount detection device. The detection result of the water amount detection device is utilized, for example, for an operation of a valve 17 described later (details will be described later).

Figure 3:
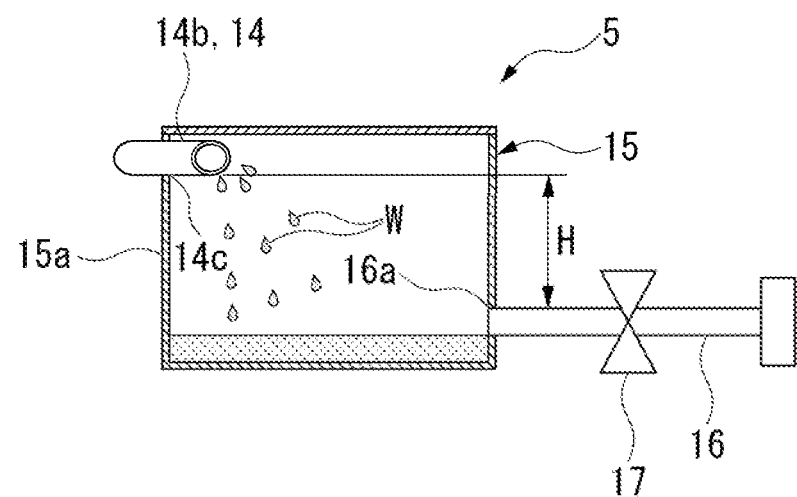
FIG. 3 is a schematic configuration view showing a drain unit according to the embodiment.

FIG. 3 is a schematic configuration view showing a drain unit 5.

The drain unit 5 drains, for example, water (refrigerant) leaked from the cooling unit 4 to the outside of the electric power apparatus housing 2.

As shown in FIG. 2 and FIG. 3, the drain unit 5 includes: a drain pan 13, having an upper surface 18, that is provided between an electrical device 3 corresponding to each shelf plate 9 and disposed on the shelf plate 9 and the unit main body 10 of the cooling unit 4; a drain hose (an example of a discharge portion in the claims) 14 having one end 14a connected to each drain pan 13; a drain housing (an example of a discharge housing in the claims) 15 to which another end 14b of the drain hose (an example of a hose in the claims) 14 is connected; and a drain piping 16 that is connected to the drain housing 15.

The drain pan 13 is a tray that receives water leaked from the cooling unit 4. The drain pan 13 is formed in a shallow box shape having an opened top portion. The one end 14a of the drain hose 14 is connected to a corner portion of a side wall 13a of the drain pan 13. A bottom portion of the drain pan 13 has a water gradient such that water flows toward a point where the one end 14a of the drain hose 14 is connected.

The drain hose 14 has an insulation property. For example, the drain hose 14 is formed of a resin. The other end 14b of each drain hose 14 extends to the lowermost portion of the electric power apparatus housing 2 and is connected to the drain housing 15 housed in the drain chamber S2 of the electric power apparatus housing 2.

The drain housing 15 has an insulation property and is formed in a square box shape. For example, the drain housing 15 is formed of a resin.

As shown in detail in FIG. 3, the position of a connection portion (an example of a discharge connection portion in the claims) 14c to the drain housing 15 in the other end 14b of the drain hose 14 is located at an upper portion of a side wall 15a of the drain housing 15. The other end 14b of the drain hose 14 protrudes from an inner surface of the side wall 15a into the drain housing 15. A protrusion direction of the other end 14b of the drain hose 14 from the inner surface of the side wall 15a is a horizontal direction or a slightly oblique direction such that the other end 14b is directed slightly downward relative to the horizontal direction.

The drain piping 16 is connected to a lower portion of the side wall 15a of the drain housing 15. In the side wall 15a of the drain housing 15, it is ensured that a height H between the position of a connection portion (an example of a piping connection portion in the claims) 16a of the drain piping 16 and the position of the connection portion 14c of the drain hose 14 is a sufficient height (distance).

Such a drain piping 16 is in communication with an external drain ditch (not shown). A valve 17 that opens and closes the inside of the drain piping 16 is provided on the middle of the drain piping 16.

Next, an action of the drain unit 5 is described.

For example, when water has leaked from the cooling unit 4, the water drops down to the drain pan 13 disposed below the cooling unit 4. The water flows into the drain housing 15 via the drain hose 14. The water accumulated in the drain housing 15 is drained to the outside of the electric power apparatus 1 by opening the valve 17 of the drain piping 16.

Here, in the side wall 15a of the drain housing 15, it is ensured that the height H between the position of the connection portion 16a of the drain piping 16 and the position of the connection portion 14c of the drain hose 14 is a sufficient height (distance). Therefore, the water discharged from the other end 14b of the drain hose 14 drops as a droplet W and is accumulated at a bottom portion of the drain housing 15. Therefore, in the drain housing 15, the flow of water is completely separated between the drain hose 14 and the drain piping 16. Further, the drain housing 15 is formed of, for example, a resin having an insulation property. Accordingly, the drain hose 14 and the drain piping 16 are not electrically connected via the water.

The drain piping 16 is in communication with the external drain ditch (not shown) and is in a ground state. On the other hand, since insulation is not ensured between the drain pan 13 and the electrical device 3 and the cooling unit 4, the drain pan 13 becomes a main circuit potential. As a result, water that flows out of the drain pan 13 also becomes the main circuit potential. However, since the drain pan 13 and the drain piping 16 are not electrically connected via water and are separated from each other, it is possible to prevent a ground fault of the electrical device 3.

The opening and closing of the valve 17 may be operated manually or electrically. When an electric operation is performed, the valve 17 may be opened, for example, on the basis of a detection result of the water amount detection device (not shown) provided on the cooling, unit 4. That is, for example, when the water amount detection device detects that the amount of water which circulates in the refrigerant piping 12 becomes less than a predetermined threshold value, it is assumed that water is accordingly accumulated in the drain housing 15. Therefore, the valve 17 is opened, and the water accumulated in the drain housing 15 is drained.

The valve 17 is not always opened, and thereby, it is possible to prevent the water in the drain housing 15 from always being grounded. As a result, it is possible to further reliably prevent a ground fault of the electrical device 3.

As a method of detecting the amount of water accumulated in the drain housing 15, a sensor that detects the amount of water accumulated in the drain housing 15 may be provided without using the water amount detection device (not shown). The valve 17 may be opened based on the detection result of the sensor. The valve 17 may be opened at a predetermined time interval.

In this way, the drain unit 5 described above includes: the drain pan 13 that receives water or the like leaked from the cooling unit 4; the drain hose 14 that discharges the water accumulated in the drain pan 13; the grounded drain piping 16; and the drain housing 15 that prevents water from flowing continuously between the drain hose 14 and the drain piping 16. Therefore, it is possible to prevent the drain pan 13 and the drain piping 16 from being electrically connected via the water or the like leaked from the cooling unit 4. Accordingly, even when the drain pan 13 is charged to the main circuit potential, it is possible to prevent a ground fault of the electrical device 3 caused by the water leaked from the cooling unit 4.

In the drain housing 15, in order to prevent water from flowing continuously between the drain hose 14 and the drain piping 16, the height H between the position of the connection portion 16a of the drain piping 16 and the position of the connection portion 14c of the drain hose 14 is ensured by a sufficient height (distance). In this way, by utilizing a height difference between the position of the connection portion 16a of the drain piping 16 and the position of the connection portion 14c of the drain hose 14, it is possible to reliably prevent water from continuously flowing by a simple structure.

The drain hose 14 and the drain housing 15 are formed of a resin having an insulation property, and thereby, it is possible to reliably prevent a ground fault of the electrical device 3 caused by water leaked from the cooling unit 4 only by blocking the continuous flow of water in the drain housing 15.

In the drain housing 15, the other end 14b of the drain hose 14 protrudes from the inner surface of the side wall 15a into the drain housing 15. Therefore, water discharged from the other end 14b of the drain hose 14 into the drain housing 15 does not flow on the side wall 15a. As a result, it is possible to reliably drop the water from the other end 14b of the drain hose 14 as a droplet W (refer to FIG. 3). Accordingly, in the drain housing 15, it is possible to further reliably prevent water from flowing continuously between the drain hose 14 and the drain piping 16.

The drain pan 13 is electrically connected to the electrical device 3 and is charged to the main circuit potential. Here, for example, when a configuration is employed in which the electrical connection between the drain pan 13 and the electrical device 3 is cut off, for example, such that the drain pan 13 has a ground potential, for example, the electrical device 3 is provided on the drain pan 13 via an insulator. In such a configuration, the size of the entire electric power apparatus 1 is increased since the insulator is provided. In the present embodiment, by causing the drain pan 13 to have a main circuit potential, it is possible to decrease the size of the entire electric power apparatus 1. Further, even when the drain pan 13 has the main circuit potential, it is possible to reliably prevent a ground fault of the electrical device 3.

The above embodiment is described using a case in which the drain housing 15 is provided as a liquid separation part for preventing water from flowing continuously between the drain hose 14 and the drain piping 16. The above embodiment is described using a case which, in the drain housing 15, the height H between the position of the connection portion 16a of the drain piping 16 and the position of the connection portion 14c of the drain hose 14 is ensured by a sufficient height (distance). However, the embodiment is not limited thereto; and a configuration in which water does not flow continuously between the drain hose 14 and the drain piping 16 may be employed as the liquid separation part. For example, by blowing air, water may be prevented from flowing continuously between the drain hose 14 and the drain piping 16.

The above embodiment is described using a case in which the cooling unit 4 is a so-called water cooling system in which water is used as a refrigerant. However, the embodiment is not limited thereto, and the refrigerant may be a liquid.

The above embodiment is described using a case in which the positions of the connection portion 16a of the drain piping 16 and the connection portion 14c of the drain hose 14 are provided on the side wall 15a of the drain housing 15. However, the embodiment is not limited thereto, and there may be a height difference between the position of the connection portion 16a of the drain piping 16 and the connection portion 14c of the drain hose 14. For example, the connection portion 16a of the drain piping 16 may be provided on a top plate of the drain housing 15, and the connection portion 16a of the drain piping 16 may be provided on a bottom wall of the drain housing 15.

The above embodiment is described using a case in which the valve 17 is provided on the drain piping 16. However, the embodiment is not limited thereto, and the valve 17 may not be provided on the drain piping 16.

The above embodiment is described using a case in which the drain hose 14 is provided as a discharge portion that discharges water of the drain pan 13. However, the embodiment is not limited thereto, and the discharge portion may be a member having an insulation property and capable of discharging water of the drain pan 13. For example, a configuration such as a rain gutter or a configuration such as a straw may be used. The discharge portion may not extend continuously to the discharge housing 15.

The above embodiment is described using a case in which the drain hose 14 and the drain housing 15 are formed of a resin having an insulation property. However, the embodiment is not limited thereto, and the drain hose 14 and the drain housing 15 may have an insulation property. For example, even when the drain hose 14 itself and the drain housing 15 itself do not have an insulation property, the drain hose 14 and the drain housing 15 may be coated by a film having an insulation property or the like.

According to at least one embodiment described above, it is possible to prevent the drain pan 13 and the drain piping 16 from being electrically connected via the water or the like leaked from the cooling unit 4. Therefore, even when the drain pan 13 is charged to the main circuit potential, it is possible to prevent a ground fault of the electrical device 3 caused by the water leaked from the cooling unit 4.

By utilizing the height difference between the position of the connection portion 16a of the drain piping 16 and the position of the connection portion 14c of the drain hose 14, it is possible to reliably prevent water from continuously flowing by a simple structure.

The drain hose 14 and the drain housing 15 are formed of a resin having an insulation property, and thereby, it is possible to reliably prevent a ground fault of the electrical device 3 caused by water leaked from the cooling unit 4 only by blocking the continuous flow of water in the drain housing 15.

In the drain housing 15, the other end 14b of the drain hose 14 protrudes from the inner surface of the side wall 15a into the drain housing 15. Therefore, water discharged from the other end 14b of the drain hose 14 into the drain housing 15 does not flow on the side wall 15a. As a result, it is possible to reliably drop the water from the other end 14b of the drain hose 14 as a droplet W (refer to FIG. 3). Accordingly, in the drain housing 15, it is possible to further reliably prevent water from flowing continuously between the drain hose 14 and the drain piping 16.

The drain pan 13 is electrically connected to the electrical device 3 and is charged to the main circuit potential. Here, for example, when a configuration is employed in which the electrical connection between the drain pan 13 and the electrical device 3 is cut off, for example, such that the drain pan 13 has a ground potential, for example, the electrical device 3 is provided on the drain pan 13 via an insulator. In such a configuration, the size of the entire electric power apparatus 1 is increased since the insulator is provided. In the present embodiment, by causing the drain pan 13 to have the main circuit potential, is possible to decrease the size of the entire electric power apparatus 1. Further, even when the drain pan 13 has the main circuit potential, it is possible to reliably prevent a ground fault of the electrical device 3.

The valve 17 is provided and is not always opened, and thereby, it is possible to prevent the water in the drain housing 15 from always being grounded. As a result, it is possible to further reliably prevent a ground fault of the electrical device 3.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

1 Electric power apparatus
2 Electric power apparatus housing (apparatus housing)
3 Electrical device
4 Cooling unit
5 Drain unit
13 Drain pan
14 Drain hose (hose)
14c Connection portion (discharge connection portion)
15 Drain housing (discharge housing)
16 Drain piping
16a Connection portion (piping connection portion)
17 Valve

The invention claimed is:

1. An electric power apparatus, comprising:
a discharge unit;
an apparatus housing on which the discharge unit is provided;
an electrical device that is housed in the apparatus housing; and
a cooling unit that is provided in the apparatus housing and cools the electrical device by a liquid refrigerant;
wherein the discharge unit comprises:
a drain pan that receives a liquid;
a discharge portion that has an insulation property, is connected to the drain pan, and drains the liquid remaining in the drain pan;
a grounded drain piping;
a liquid separation part that has an insulation property and prevents the liquid from flowing continuously between the discharge portion and the drain piping; and
a valve that is provided on the drain piping and opens and closes an inside of the drain piping;
wherein the electrical device is disposed directly on the drain pan without ensuring insulation,
the drain pan is charged to a potential of the electrical device,
the liquid separation part comprises a discharge housing that has an insulation property and includes a discharge connection portion to which the discharge portion is connected and a piping connection portion to which the drain piping is connected, and
the valve opens the drain piping in at least one of a case in which an amount of the liquid accumulated in the discharge housing exceeds a predetermined threshold value, a case in which a flow rate of the liquid refrigerant is less than a predetermined threshold value, and a case in which a predetermined time elapses.

2. The discharge unit according to claim 1, wherein the discharge connection portion is arranged at a predetermined interval in a gravity direction above the piping connection portion.

3. The discharge unit according to claim 2, wherein the discharge portion includes a hose that has an insulation property, connects the drain pan to the discharge housing, and has an inside through which the liquid flows, and
an end portion on a side of the discharge housing of the hose protrudes from an inner wall of the discharge housing toward an inside of the discharge housing.

* * * * *